United States Patent
Denning et al.

(10) Patent No.: US 6,187,682 B1
(45) Date of Patent: Feb. 13, 2001

(54) INERT PLASMA GAS SURFACE CLEANING PROCESS PERFORMED INSITU WITH PHYSICAL VAPOR DEPOSITION (PVD) OF A LAYER OF MATERIAL

(75) Inventors: Dean J. Denning, Del Valle; Rama I. Hegde, Austin; Sam S. Garcia, Austin; Robert W. Fiordalice, Austin, all of TX (US)

(73) Assignee: Motorola Inc., Schaumburg, IL (US)

( * ) Notice: Under 35 U.S.C. 154(b), the term of this patent shall be extended for 0 days.

(21) Appl. No.: 09/084,276

(22) Filed: May 26, 1998

(51) Int. Cl.[7] .................. H01L 21/311; H01L 21/302; H01L 21/461; C23C 14/00; C23C 14/32
(52) U.S. Cl. .................. 438/694; 438/710; 438/913; 204/192.3
(58) Field of Search .................. 134/1.2, 1.3; 438/710, 438/707, 706, 695, 694, 913; 204/192.3; 427/534

(56) References Cited

U.S. PATENT DOCUMENTS

| 3,479,269 | * | 11/1969 | Byrnes et al. | 204/298 |
|---|---|---|---|---|
| 4,585,517 | * | 4/1986 | Stemple | 156/643 |
| 5,041,362 | * | 8/1991 | Douglas | 430/313 |
| 5,207,868 | * | 5/1993 | Shinohara | 156/656 |
| 5,510,011 | * | 4/1996 | Okamura et al. | 204/192.3 |
| 5,807,467 | * | 9/1998 | Givens et al. | 204/192.12 |
| 5,849,640 | * | 12/1998 | Hsia et al. | 438/734 |
| 5,990,013 | * | 11/1999 | Berenguer et al. | 438/706 |
| 5,997,699 | * | 12/1999 | Leiphart | 204/192.3 |
| 6,054,331 | * | 4/2000 | Woo et al. | 438/3 |

FOREIGN PATENT DOCUMENTS 5407867   4/1995  (JP).

* cited by examiner

*Primary Examiner*—Richard Elms
*Assistant Examiner*—Adam Pyonin (57) ABSTRACT

A method for insitu performing a cleaning operation along with a physical sputtering operation begins by placing a wafer (26) into a chamber (12). A plasma (30) is generated within the chamber (12) using an inert, noble, or reducing gas. The gas is ionized to form ions (32) within the plasma (30). Power is provided to various components (16, 22, and 24) within the chamber (12) to ensure that the ions (32) are accelerated towards the wafer (26) during first stages of wafer processing. This acceleration of the ions (32) towards the wafer (26) will clean a surface of the wafer (26). Following this cleaning operation, power supplied within the chamber (12) is altered to accelerate the ions (32) into a reverse direction so that the ions (32) impact a sputter target (20). Due to ionic bombardment of the target (20), a material is sputtered onto a clean surface of the wafer (26) in an insitu manner.

21 Claims, 7 Drawing Sheets

INERT PLASMA GAS SURFACE CLEANING PROCESS PERFORMED INSITU WITH PHYSICAL VAPOR DEPOSITION (PVD) OF A LAYER OF MATERIAL

FIELD OF THE INVENTION

The present invention relates generally to semiconductor manufacturing, and more particularly, to performing an insitu argon (Ar) plasma clean on a surface of a substrate just prior to sputtering a surface-critical film on the surface of the substrate.

BACKGROUND OF THE INVENTION

In the integrated circuit (IC) industry, it is important to obtain atomically or near atomically clean substrate surfaces prior to formation of various films over the top of these surfaces. Specifically, various processing steps, such as the formation of silicide layers on semiconductive surfaces, the formation of glue layers between two layers of material on an IC, and the formation of inlaid barrier layers to protect dielectric layers from metallic contaminants within the inlaid interconnect are very sensitive to surface cleanliness. If a sufficiently clean surface is not properly formed before deposition of these types of surface-critical films, contact/via resistance may be too high, poor adhesion between layers of material may result wherein IC reliability is reduced, retarded film formation may occur (e.g., a silicide may never properly form), and/or poor texture and/or grain structure may result in the sputtered film.

In order to attempt to clean a surface of a substrate before film deposition to avoid the above disadvantages, current IC manufacturers use one chamber for substrate surface cleaning and a separate chamber for film sputtering. A wafer is first positioned within the cleaning chamber in order to initiate a cleaning operation of the wafer surface. The wafer is then moved from the cleaning chamber to a deposition chamber to form the required sputter film on the previously-cleaned substrate surface.

However, this two-chamber process is disadvantageous for several reasons. First, any time a wafer is transferred between chambers, even in a cluster tool, there is a tendency for the wafer surface to become contaminated with harmful contaminants such as heavy metals. There is also a tendency for the wafer surface to become oxidized by exposure to an oxidation ambient during the transfer. This oxidation or contamination of the surface can result in all of the disadvantages discussed above (e.g., poor interconnect conductivity, poor film adhesion, etc.). In addition, the maintenance and operation of two separate chambers is expensive and the throughput of wafers through a two-chamber system can be substantially reduced. The increased maintenance and reduced throughput will adversely increase IC manufacturing costs.

In addition to using a two-chamber approach, another known method uses reactive chemical cleans that are insitu with the deposition/sputter process in order to clean the substrate surface before film formation. Typically, the reactive chemistries that are used contain either chlorine (Cl) or fluorine (F). In this insitu chemical surface clean method, the surface that requires cleaning is exposed to Cl or F gas. The Cl or F gas is heated to initiate a chemical reaction with the wafer surface causing a chemical clean, that has no physical cleaning action, over the wafer surface.

A disadvantage with this non-physical chemical clean is that it typically requires higher temperatures in order to enable the required chemical reaction. Higher temperatures are typically disadvantageous in the IC industry since certain semiconductor films and doped junctions are adversely affected by higher temperatures. In addition, the use of reactive chemistries to perform surface cleans may leave residual Cl or F material on various exposed surfaces of the substrate. Residual F material can form undesired compounds (e.g. hydrofluoric acid, HF) which can etch or otherwise damage layers within the IC after their formation. In addition, the presence of residual Cl is disadvantageous since it is very corrosive to metals, and may also form damaging compounds within the IC after its formation and may react with the sputter material itself. Furthermore, the use of an insitu reactive chemistry to form a clean surface increases the cost of the processing chamber. Such a processing chamber must be made more robust to resist the corrosive properties of the reactive chemistries. In addition to necessitating a more expensive chamber, these reactive chemistry processes also increase chamber maintenance costs.

Therefore, a need exists in the industry for a method to form clean surfaces prior to sputtered film formation whereby one or more of reduced via or contact resistance, improved film adhesion, improved film formation, improved film grain structure, reduced process temperature, reduced wafer costs, improved wafer throughput, reduced chamber maintenance, and/or reduced presence of volatile IC residuals (e.g., reduced use of Cl and F) is obtained.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method for insitu cleaning a surface of a wafer substrate just prior to sputtering a layer of material onto the clean surface of the wafer insitu in a single process chamber. This process begins by placing the wafer into the single processing chamber. An inert gas, noble gas, or a reducing gas is introduced into the semiconductor processing chamber. A coil internal to the chamber is radio frequency (RF) powered to create a plasma from the gas whereby charged ions from the input inert, noble or reducing gas are generated. The wafer is biased to direct the charged ions from the plasma down towards the wafer surface to result in physical sputtering of contaminants and oxides from a surface of the wafer. This sputtering off of the wafer surface results in cleaning of the wafer surface.

After this cleaning process is performed by physical sputtering, electrical potentials in the chamber are altered so that the charged ions within the plasma are redirected to sputter material from a sputter target located within the single process chamber. Material sputtered from the target deposits onto the clean surface of the wafer in an insitu manner whereby a thin film of material is deposited onto the wafer using the same chamber.

By performing this insitu clean and physical vapor deposition (PVD) sputter process, layers of material can be formed on an IC whereby one or more of the following can be achieved: reduced resistance; improved adhesion between IC films; improved quality of sputtered film formation; preferred grain structure of the sputtered film; reduction in overall wafer manufacturing costs; improved wafer throughput through sputtering systems; reduced sputter process chamber maintenance; reduced formation of volatile processing residuals on an IC; and/or reduced process temperature.

The invention can be further understood with reference to FIGS. 1–10.

Figure 1:
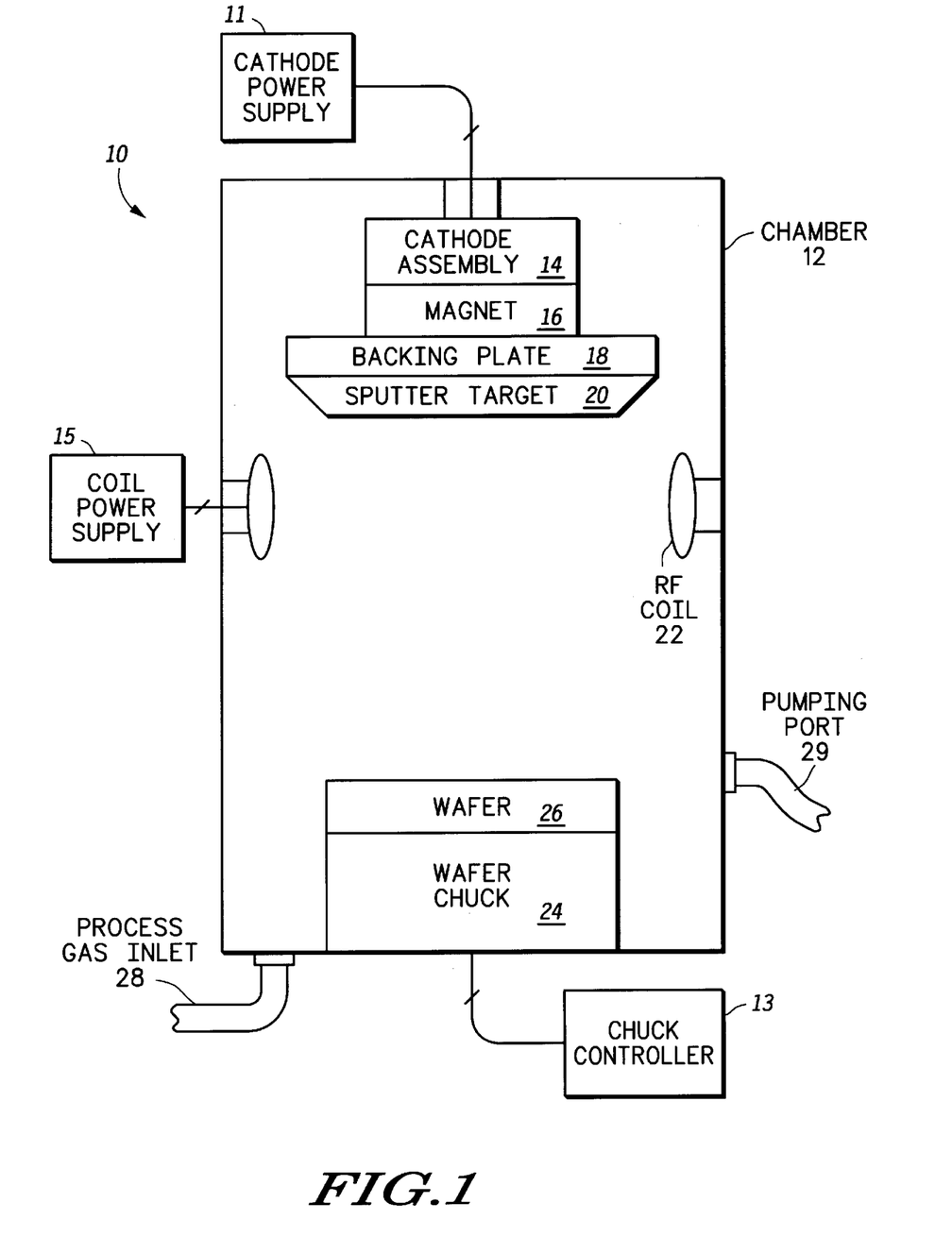
FIG. 1 illustrates, in a cross sectional diagram, a semiconductor processing chamber which can be used to perform insitu wafer cleaning and film sputtering in a single processing chamber in accordance with the present invention.

FIG. 1 illustrates an ultra high vacuum (UHV) semiconductor processing system 10. Generally, the system 10 contains load locks for loading wafers into the system 10, a transfer chamber containing a robot arm that moves wafers between various specific processing chambers in the system 10, and one or more processing chambers such as the processing chamber 12 as illustrated in FIG. 1. In addition to the processing chamber 12, the chamber 12 within the system 10 is connected to a cathode power supply 11, a chuck controller 13, and a coil power supply 15. Generally, the units 11, 13, and 15 of FIG. 1 may be separate units/computers or may be centralized within a single computer system coupled to the chamber 12 by electrical communication wires.

The cathode power supply 11 is coupled to a cathode/magnet 16 located within the chamber 12. The cathode power supply 11 provides one of either radio frequency (RF), direct current (DC), microwave, or pulsed DC power to the cathode/magnet located within the chamber 12. The coil power supply 15 is coupled to an RF coil 22 located within the chamber 12, and the supply 15 provides one of either RF power, microwave, or pulsed DC power to the coil 22 located within the chamber.

The chuck controller 13 controls various properties of a wafer chuck 24 located within the chamber 12. Specifically, the chuck controller 13 provides power to the wafer 26 and/or to the wafer chuck 24 whereby the wafer 26 can be biased with one or more of RF power, DC power, microwave power, or pulsed DC power. In addition, the chuck controller 13 can control a temperature of the wafer chuck 24 whereby a processing temperature of the wafer 26 within the chamber 12 can be accurately controlled between temperature of less than 0 degrees Celsius (° C.) and up to hundreds of degrees C. The chuck controller 13 may also control backside gas flow to the wafer 26 located within the chamber 12. In addition, the chuck controller 13 can control various servo motors around the chamber 12 which enable one or more of X, Y, and Z motion of the wafer chuck 24 within the chamber 12 to allow for proper positioning of the wafer 26 within the processing chamber 12.

Preferably, for the processing taught herein, it has been found that DC power is preferably supplied by the cathode power supply 11 to the magnet 16, RF power is preferably supplied from the coil power supply 15 to the RF coil 22, and RF power is preferably supplied from the chuck controller 13 to the wafer 26 and/or chuck 24.

The chamber 12 contains a cathode assembly 14 which is connected to a magnet 16. The magnet 16 is coupled to the cathode power supply 11 and is provided with electrical power to generate an electric field within the chamber 12. The magnet 16 is used to contain a process plasma that is formed within the chamber 12 within close proximity to a sputter target 20. Chamber 12 contains a backing plate 18 located adjacent the magnet 16. The backing plate provides support for the sputter target 20 as illustrated in FIG. 1. Depending upon the application, the sputter target 20 is comprised of one or more of copper, tantalum, silicon, titanium, aluminum, tungsten, cobalt, platinum, nickel, nitrides thereof, silicide thereof, composites and alloys thereof, and/or like metallic compounds.

An RF coil 22 is cylindrically located around a periphery of the chamber 12. Typically, the RF coil 22 will surround a process plasma that is formed within the chamber 12 (see FIG. 2 for this type of illustration). Generally, the RF coil 22 is powered within the chamber to enable the creation of a plasma 30 within the chamber 12. Chamber 12 contains a wafer chuck 24 which is used to physically support one or more wafers 26. Generally, the wafer chuck 24 can be either a clamped wafer chuck or an unclamped wafer chuck. If the wafer chuck is a clamped chuck, the clamping mechanism may either be a physical mechanism or a clamping mechanism that uses electrostatic force. Generally, the wafer 26 illustrated in FIG. 1 is preferably a semiconductor wafer such as a wafer formed of silicon, germanium, gallium arsenide, silicon carbide, germanium silicon, epitaxial regions, silicon on insulator (SOI) material, and the like.

In order to allow gases to flow in and out of the process chamber 12 and to allow for control of chamber pressure within the chamber 12, an input process gas inlet 28 and an output pumping port 29 are illustrated in FIG. 1. Process gases can be input to the chamber 12 through the inlet 28, and the pumping port 29 is typically connected to a cryogenic or turbo molecular pump to allow gases to be removed from the chamber 12. The system 10 of FIG. 1 is used to perform the insitu clean and sputter deposition process taught herein.

Figure 2:
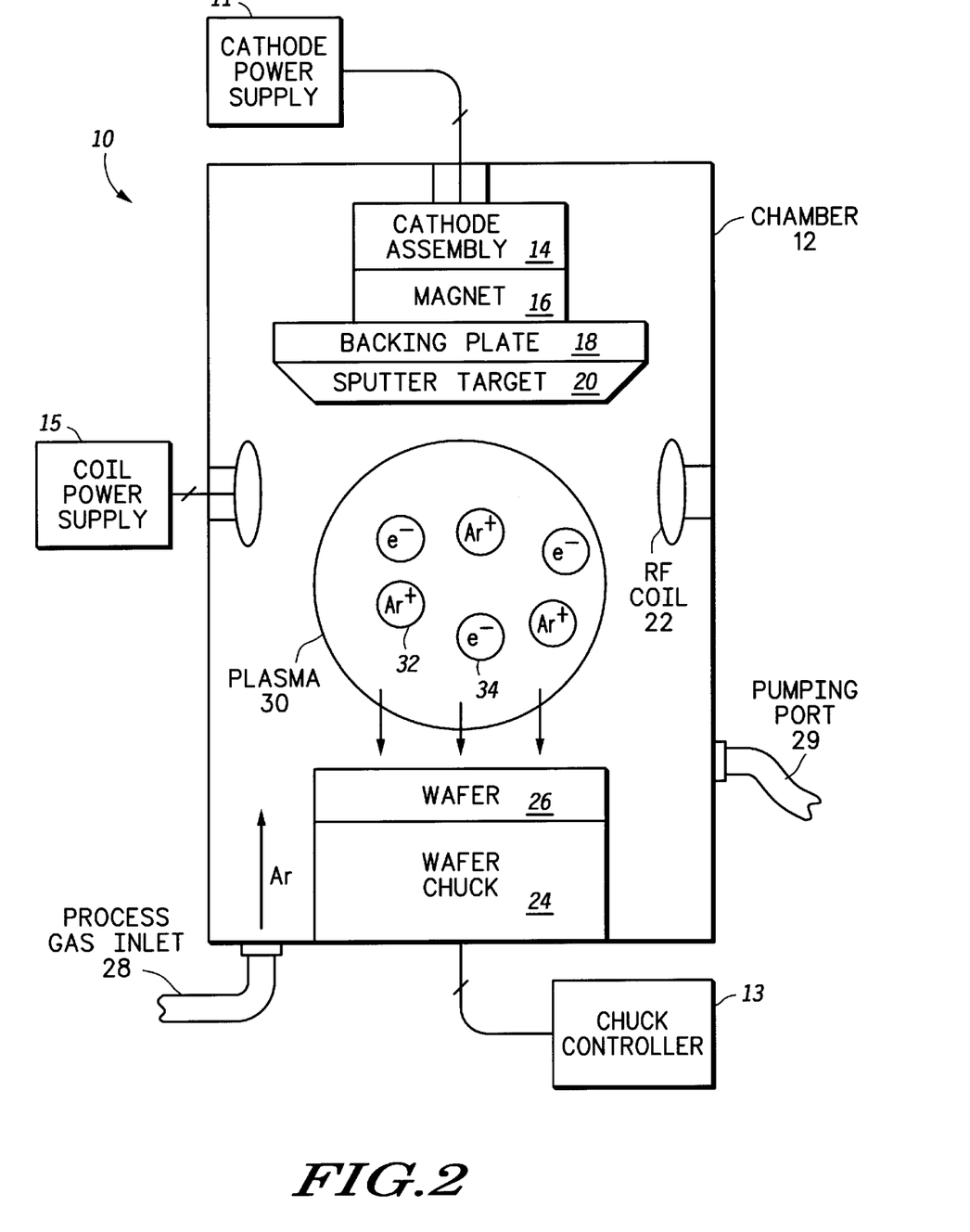
FIG. 2 illustrates, in a cross sectional diagram, a method for using the chamber of FIG. 1 to create an environment which can insitu clean a surface of a wafer in accordance with the present invention.

FIG. 2 illustrates the various steps which are to be performed to ensure that the wafer 26 is properly cleaned within the chamber before sputtering. First, an inert gas, noble gas, or a reducing gas is provided via the process gas inlet 28 to the chamber 12. In a preferred form, argon (Ar) gas is the input gas provided to the chamber 12 in FIG. 2. However, any one or more of nitrogen ($N_2$), helium (He), neon (Ne), xenon (Xe), krypton (Kr), hydrogen ($H_2$), a combination thereof, or a like gas can be provided in lieu of the Ar illustrated in FIG. 2. In addition, combinations of these gases with Ar may be used in FIG. 2. Generally, the flow of the process gas through inlet 28 allows the chamber 12 to be pressurized to a pressure somewhere between about 5 and 100 millitorr (mTorr). In a preferred form, the processing pressure for the chamber 12 is maintained somewhere in the vicinity of 30–40 mTorr. Typically, this pressure can be achieved by providing a flow of 10–100 standard cubic centimeters per minute (sccm) of Ar in the chamber 12 through the inlet 28 through use of a mass flow controller (MFC) coupled to the inlet 28.

Once the chamber 12 is pressurized to an appropriate level with the input gas, the RF coil 22 is powered by the coil power supply 15. Generally, the RF power supplied to the coil 22 lies roughly within a range of 500–2000 watts (W). A preferred operating point is typically within a vicinity of roughly 1500 W. The supplying of this power to the RF coil 22 will generate a plasma 30 within the chamber 12 as illustrated in FIG. 2. Note that the plasma 30 of FIG. 2 is a graphical illustration of the plasma and that placement, size, and shape, of the actual plasma will vary depending upon voltage biasing, size of the chamber, etc. The plasma will contain many different ionic species, two of which are illustrated in FIG. 2. FIG. 2 specifically illustrates positively-charged argon (Ar+) ions 32, and electrons (e–) 34 which are formed within the plasma 30. At this point, there is no cathode power provided by the cathode power supply 11. In the alternative, the cathode power supply 11 is providing a significantly low level of power whereby sputtering from the target 20 is either nonexistent or minimal. Generally, the sputter rate of material from the wafer surface during a cleaning time period should be greater than any deposition/sputter rate of material onto the wafer.

The wafer chuck 24 is then powered by the chuck controller 13 in FIG. 2. Generally, the RF power supplied by the chuck controller 13 is within a range of 100 W to 500 W. It is important to note that the level of power supplied to the wafer chuck 24 and the wafer 26 will allow an engineer to set an etch rate of contaminants and oxide on a surface of the wafer 26. A low power provided by the chuck controller 13 will result in a lower etch rate in the vicinity of roughly 50 angstroms (Å) per minute to several hundred Å per minute. A higher power provided by the chuck controller 13, in the vicinity of 300–500 W, will result in etch rates of contaminants and oxide on the surface of the wafer 26 on the order of 500–1200 Å per minute. Therefore, depending upon wafer bias, the etch/cleaning rate of oxides and contaminants from the surface of the wafer 26 can be accurately controlled at any point within a large range. In a preferred form, an etch rate of roughly 300 Å per minute is desired, wherein this etch rate can be obtained by providing a power of roughly 220–250 W to the wafer 26. Too low an etch rate adversely affects wafer throughput, and too high an etch rate may unnecessarily damage exposed IC areas on wafer 26.

By providing this power to the wafer 26 and by providing no power or minimal power to the cathode, a self-induced bias is generated on the wafer 26. This bias typically ranges between –30 and –500 volts with around –40 volts being generally acceptable. Due to this self-induced bias, the Ar+ ions 32 within the plasma 30 are accelerated towards the wafer 26. This acceleration of the ions 32 towards the wafer 26 result in a physical sputtering or physical cleaning of contaminants and residual oxides off of an exposed top surface of the wafer 26. Over a time, depending upon the power provided by the chuck controller 13, a substantially clean surface of the wafer 26 is eventually obtained by this physical sputter process. In addition to the chuck controller providing power to wafer 26, it is important to note that the chuck controller may also alter the temperature of the wafer, and change a backside flow of gas to the wafer 26 as is needed for specific applications to alter the cleaning/etching affects on the surface of the wafer 26. While sputtering of contaminants and oxide from the wafer 26, the pumping port 29 and the process gas inlet 28 remain operational under computer control to ensure that a pressure within the chamber 12 remains constant while also ensuring that sputtered byproducts from the wafer 26 are effectively removed from the chamber 12.

Figure 3:
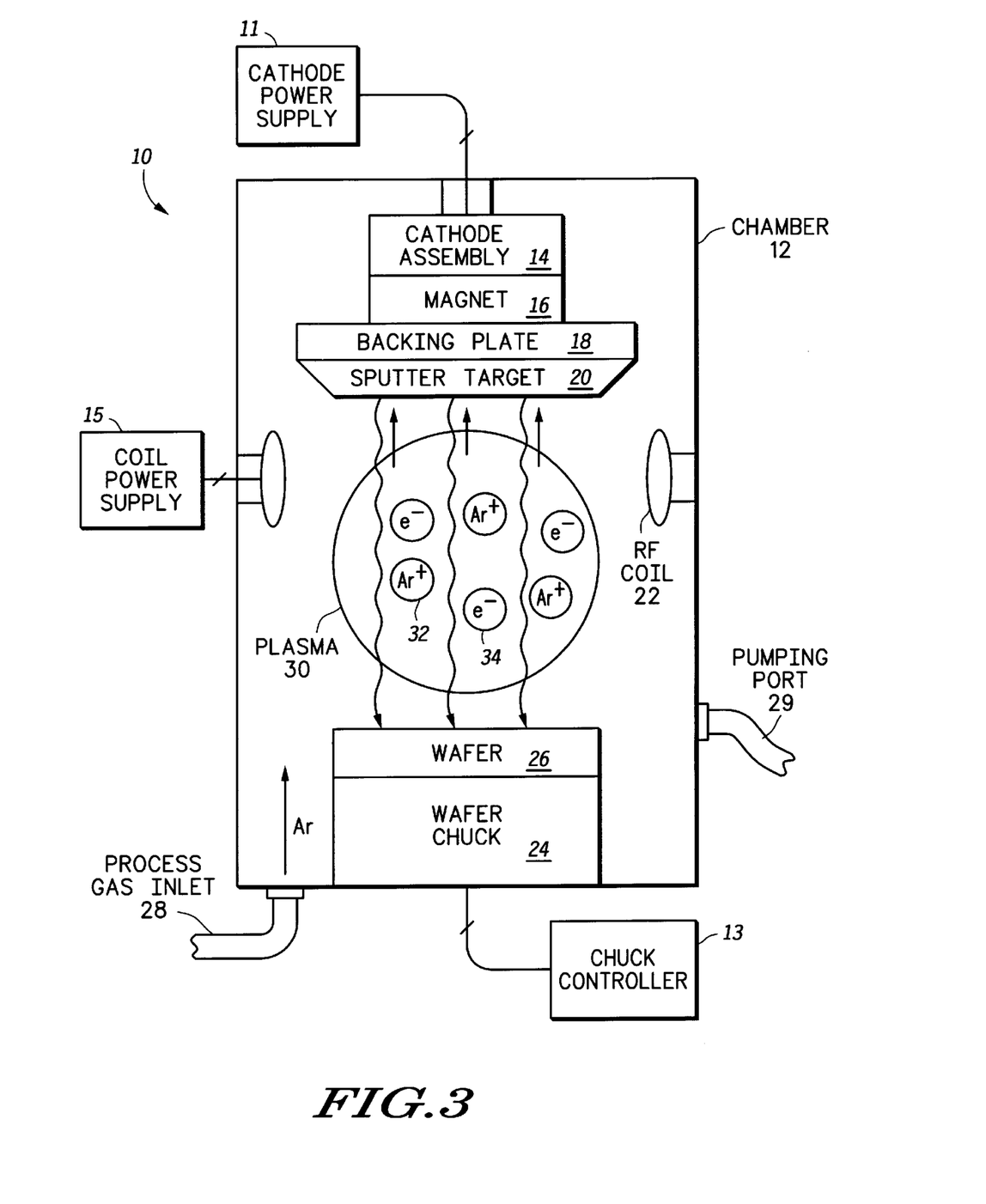
FIG. 3 illustrates, in a cross sectional diagram, an environment that can be formed within the chamber of FIG. 1 to result in insitu physical vapor deposition (PVD) or sputtering of a layer of material onto a wafer in accordance with the present invention.

FIG. 3 illustrates that a physical vapor deposition (PVD) or sputtering process is performed after the cleaning operation shown in FIG. 2. The sputtering process reverses the acceleration of the ions in the plasma 30 so that ions 32 sputter material from the sputter target 20 after the cleaning process of FIG. 2 is complete. In FIG. 3, the cathode power supply 11 will preferably provide a DC power to the magnet 16. Preferably, the same gas flow and gas composition used in FIG. 2 is maintained throughout FIG. 3. However, different gases can be pumped into the chamber in FIG. 3, and/or different flows of gases can be used in FIG. 3 other than that used in the cleaning process of FIG. 2. In addition, before the sputter/deposition processing of FIG. 3 begins, an optional pumping cycle of the chamber of FIG. 2 may be performed using the port 29. In yet other embodiments, no pump is performed between the processing of FIG. 2 and FIG. 3 in order to increase wafer throughput.

In addition to providing power to the magnet 16 through the cathode assembly 14 within chamber 12, altering the power on the coil 22 and the power on the wafer 26 may also be used to reverse the direction of the plasma 30. In a first form, the power from FIG. 2 can be maintained on the coil 22 and the power discussed for wafer 26 in FIG. 2 can be maintained in FIG. 3. However, in other embodiments, the power on one or more of the coil 22 and the wafer 26 can be reduced in FIG. 3 while the power on the magnet 16 is being increased.

Due to the changes in the power supplied by the units 11, 13, and 15 in FIG. 3, the Ar+ ions 32 are now accelerated toward the sputter target 20 instead of being accelerated toward the wafer 26. This acceleration towards the target 20 results in material being physically sputtered from the target 20. This material that is sputtered from the target 20 deposits on the wafer 26 and forms a sputtered layer of material on the cleaned surface of wafer 26. This cleaning followed by an insitu sputter operation in the same chamber without wafer movement can reduce conductive interconnect resistance. Contaminants, native oxides, and the like on the top surface of the wafer before sputtering conductive material will increase interconnect and/or contact resistance. The process shown in FIGS. 2–3 reduces the effect of these contaminants and native oxides on the conductivity of conductive IC films by removing them insitu prior to the sputter operation. By reducing contaminants in an insitu manner herein, improved adhesion between IC films results since contaminants and native oxides sometimes contribute to delamination of films or air gaps between films. Improved quality of sputtered film formation may result herein since the grain structure of a metallic film is adversely affected by contaminants and native oxides which are now reduced or eliminated via the insitu process taught herein. By using only a single chamber taught herein, the overall wafer manufacturing and maintenance costs are reduced. Improved wafer throughput through sputtering systems is possible using the process taught herein, and reduced formation of volatile processing residuals (e.g., HF and HCL) on an IC is possible when using the inert, noble or reducing gas process taught herein. Lastly, many films are temperature sensitive and doped junctions diffuse adversely with higher temperatures. The process taught herein will allow for a reduction in processing temperature whereby thermal limitations and disadvantages are reduced in severity.

Figure 4:
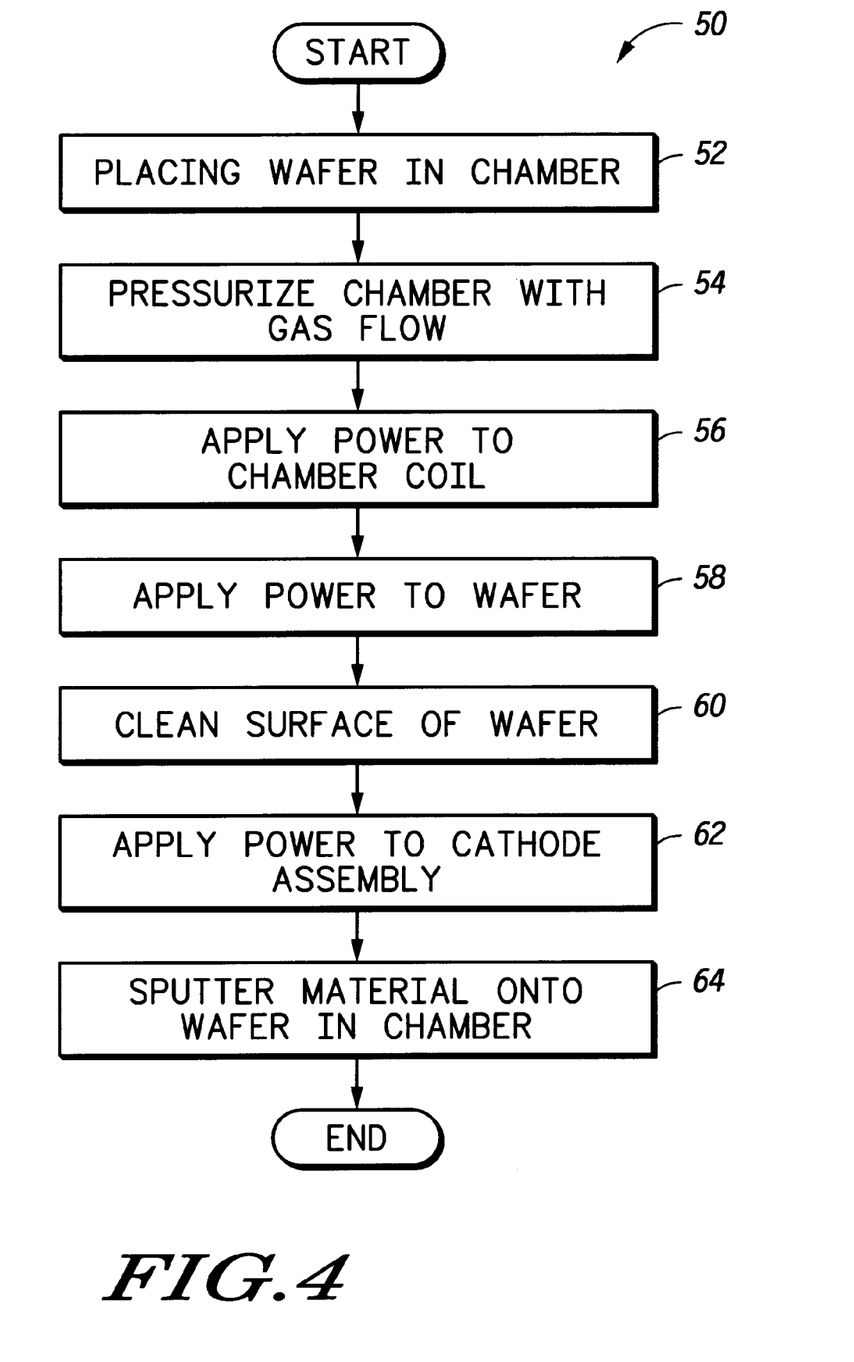
FIG. 4 illustrates, in a flow chart, a method for using the chamber of FIG. 1 to sputter a layer of material on a physically insitu cleaned surface of a wafer in accordance with the present invention.

FIG. 4 illustrates a method 50 for using the chamber illustrated in FIG. 1 to insitu perform a surface cleaning operation on a wafer and a physical sputtering of a layer of material onto the same wafer 26 in a single chamber. In a first step 52, the wafer 26 is placed into the chamber 12 as illustrated in FIG. 1. After the wafer is placed into the chamber, the chamber 12 is pressurized with an inert, noble, or reducing gas as illustrated in step 54 of FIG. 4 and illustrated in FIG. 2. The RF coil 22 of FIG. 2 is then supplied with RF power from coil power supply 15 as illustrated in step 56 of FIG. 4. The chuck controller 13 of FIG. 2 provides power to the wafer 26 as illustrated via step 58 in FIG. 4. After the chuck controller 13 and power supply 15 have provided their appropriate RF power, a plasma 30 is generated in the chamber 12 as illustrated in FIG. 2. It is important to note that the cathode power supply 11 is providing either no power or a low level of power so that Ar+ ions 32 within the plasma 30 are accelerated towards the wafer 26. This ion bombardment of the wafer 26 surface results in a cleaning of the wafer surface by physical sputtering of material off of an exposed surface of the wafer 26. This physical cleaning step is illustrated by a step 60 in FIG. 4.

It is important to note that small quantities of a reactive gas such as fluorine (F) or chlorine (Cl) can be included in the plasma 30 of FIG. 2 and included in the step 60 of FIG. 4. These small flows of reactive gases into chamber 12 can add an additional chemical wafer cleaning property to the physical wafer cleaning property provided by the Ar+ ions 32 in FIG. 2. In other words, a dual physical and chemical clean process can be utilized in step 60 of FIG. 4 while reducing the corrosive residual disadvantages associated with using entirely reactive ion gases to perform an entirely chemical clean of a surface.

After step 60 in FIG. 4, the wafer cleaning process of FIG. 2 is complete and a step 62 is performed. In step 62 in FIG. 4, the cathode power supply 11 of FIG. 3 provides power to the cathode or magnet 16 in FIG. 3. In addition, the power supplied to the RF coil 22 and the wafer 26 may be also reduced or altered in step 62. Due to these changes in supplied power in FIG. 3, the Ar+ ions 32 are now accelerated towards the sputter target 20 instead of the wafer 26. Due to this reversing of the acceleration direction of the Ar+ ions 32 in FIG. 3, step 64 in FIG. 4 is performed. In this step 64, material is sputtered from the sputter target 20 of FIG. 3 and deposited onto the clean surface of the wafer 26 to form a thin film of material on the wafer 26. Due to the insitu cleaning step of FIG. 2, which is also illustrated in step 60 of FIG. 4, being followed by the insitu sputtering of material from the target 20 as illustrated in FIG. 3 and step 64 of FIG. 4, a plurality of improved ICs are formed on the wafer 26 as taught herein.

Figure 5:
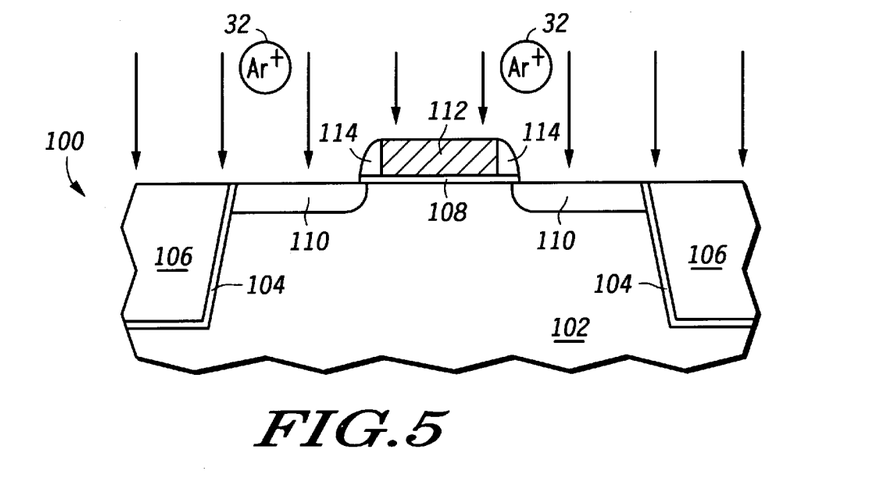
FIGS. 5–7 illustrate, in cross sectional diagrams, a method for using the insitu clean and sputtering process of FIGS. 1–4 to form improved salicide and silicide formations in accordance with present invention.
Figure 6:
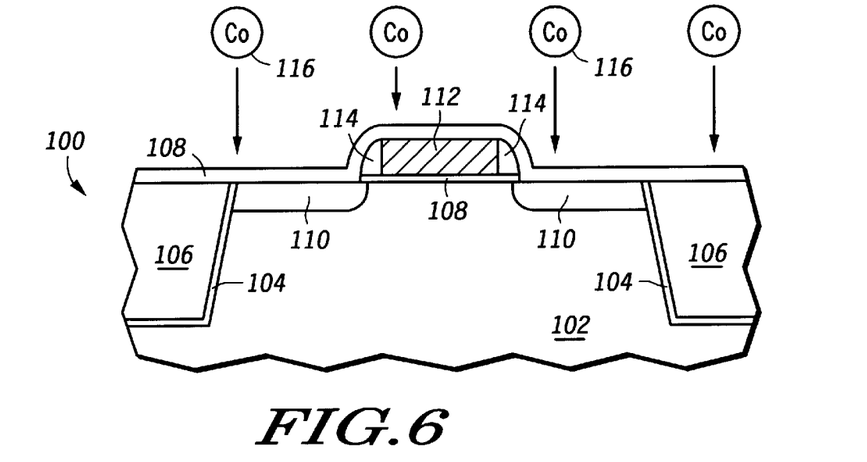
Figure 7:
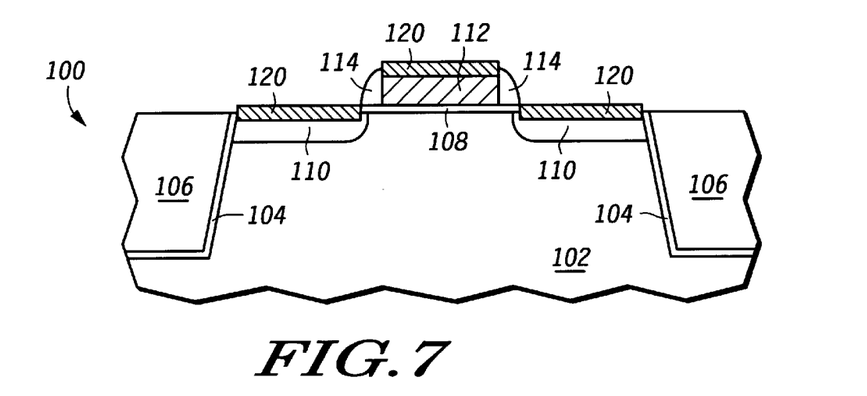
Figure 8:
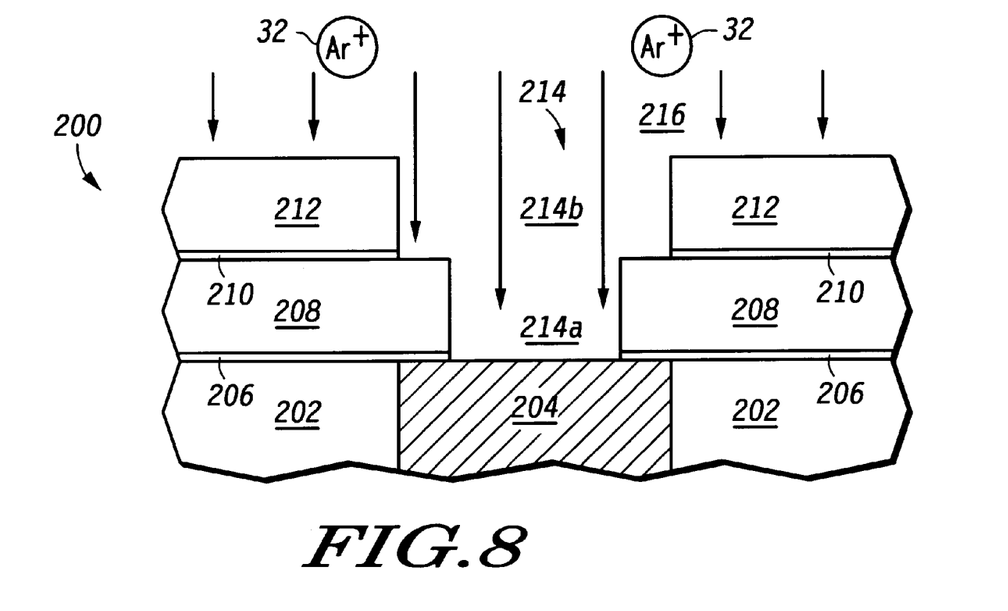
FIGS. 8–10 illustrate, in cross sectional diagrams, a method for forming an improved inlaid or dual inlaid semiconductor structure in accordance with the present invention.
Figure 9:
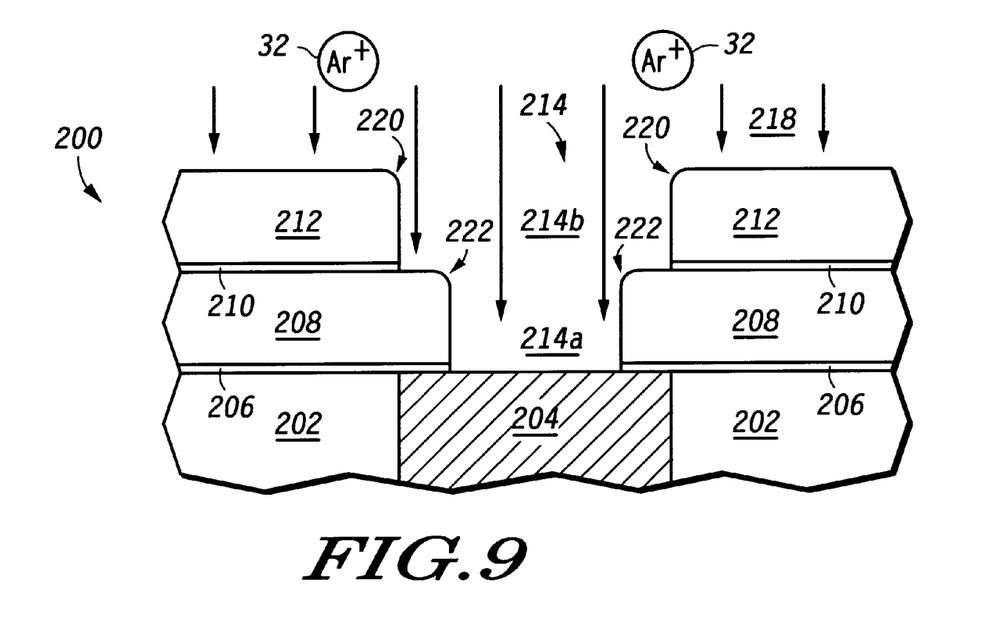
Figure 10:
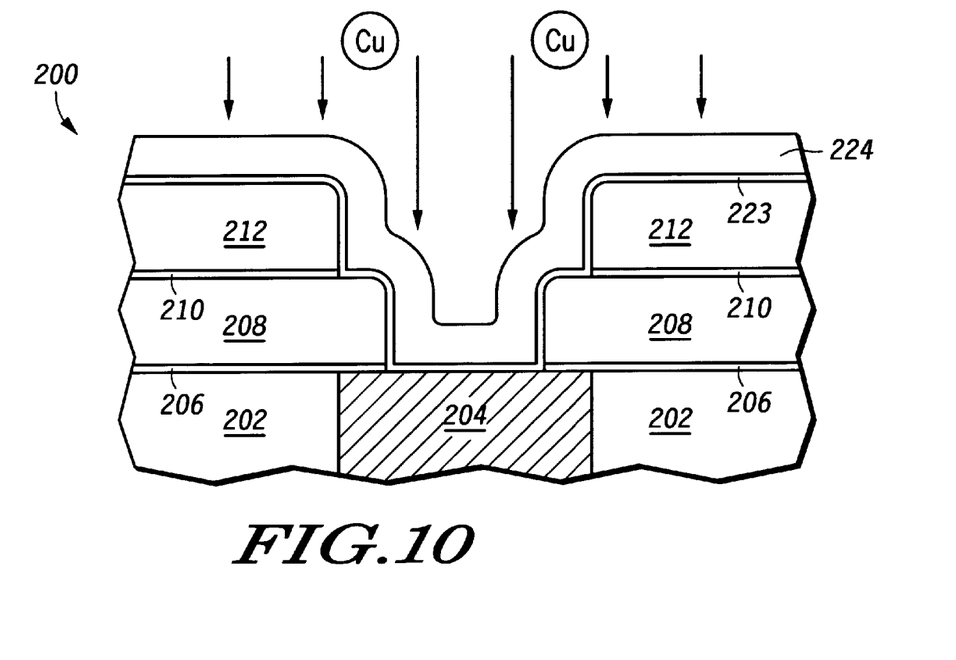

FIGS. 5–10 illustrate two different specific applications for the process discussed above with respect to FIGS. 1–4. FIGS. 5–7 illustrate a first application of the process of FIGS. 1–4 which can be used to form silicided semiconductor regions in a metal oxide semiconductor (MOS) or complimentary metal oxide semiconductor (CMOS) structure. FIGS. 8–10 illustrate how the process of FIGS. 1–4 may be used to form an inlaid or dual inlaid (i.e., damascene) structure in an improved manner.

For FIGS. 5–7, FIG. 5 illustrates an MOS transistor structure 100. This structure 100 contains a substrate 102, where substrate 102 is the major portion of the wafer 26 of FIGS. 1–3. Trench isolation is formed within the substrate 102 as illustrated by layers 104 and 106. Layer 104 is a trench liner layer 104 which is typically a thermal oxide layer, and the material used for layer 106, that fills the trench regions in FIG. 5, is a trench fill dielectric material which is typically tetraethylorthosilicate glass (TEOS). FIG. 5 illustrates a gate dielectric 108 underlying a polysilicon gate, a silicided gate electrode, an amorphous silicon gate, or metallic gate electrode 112. Dielectric sidewall spacers 114, which are preferably formed of silicon nitride, are formed laterally adjacent the gate electrode 112. Self-aligned source and drain regions 110 are formed as illustrated in FIG. 5.

After formation of the structures in FIG. 5, the structure 100 is placed within a processing chamber as illustrated in FIG. 1. The plasma 30 is generated as illustrated and discussed with respect to FIG. 2. The plasma 30 is shown above structure 100 in FIG. 5. The Ar+ ions 32 within the plasma 30 of FIG. 2 and FIG. 5 are impinged upon the surface of the structure 100 of FIG. 5. The physical impingement of these Ar+ ions 32 onto the wafer surface in FIG. 5 results in a surface cleaning of a top portion of the source and drain regions 110 and a top portion of the gate electrode 112.

After a certain time period, a satisfactory level of surface cleaning is obtained in FIG. 5, and the chamber environment is altered as discussed with respect to FIG. 3. In FIG. 3, a sputter operation from the target 20 is performed. This sputter operation is illustrated in FIG. 6, which illustrates that cobalt (Co) atoms 116 from a Co target 20 are sputtered from the Co target 20 and deposited on top of a surface of the structure 100. Note that the sputter operation of FIG. 6 and the cleaning operation of FIG. 5 are performed insitu in the same chamber as illustrated in FIGS. 1–3.

After sputtering of a significant amount of Co 116 onto the surface of the wafer in FIG. 6, a thermal heating operation is performed. This thermal operation will provide a reaction of the Co 116 deposited in FIG. 6 with the semiconductor material located within source and drain regions 110 and gate electrode 112. This reaction results in the formation of Co silicide regions 120 as illustrated in FIG. 7. A wet etch chemistry is then used to remove all unreacted Co material from a surface of the structure 100 whereby silicided source and drain regions in a silicided gate electrode are formed as illustrated in FIG. 7. Note that the silicide regions in FIG. 7 are superior to prior art silicide regions due to the fact that the insitu clean operation and insitu sputter operation illustrated in FIGS. 2 and 3, respectively, are performed for the structure 100 of FIG. 7. Due to this insitu cleaning and sputtering, the silicide regions in FIG. 7 will result in one or more of: improved silicide-to-silicon conductivity, improved uniformity of silicide formation, improved silicide grain structure, reduced wafer manufacturing costs, improved wafer throughput, reduced maintenance of the processing chamber, reduced formation of volatile residuals in or adjacent the silicide regions 120, and reduction in overall process temperature.

FIGS. 8–10 illustrate that the process of FIGS. 1–3 may be used to form a single inlaid or a dual inlaid (i.e., damascene) IC structure. FIG. 8 specifically illustrates a dual inlaid structure 200. FIG. 8 illustrates an inter-level dielectric layer (ILD) 202 which is formed by one or more of TEOS, borophosphosilicate glass (BPSG), silicon dioxide, doped glass, low k material, and/or like ILD layers. An inlaid conductive layer 204 is illustrated in FIG. 8. Preferably, the inlaid conductive layers illustrated in FIGS. 8–10 are comprised of one or more of aluminum, copper, tungsten, titanium, silver, gold, tantalum, or like metallic/ conductive compounds. An etch stop layer 206 is illustrated overlying the layers 202 and 204. The etch stop layers in FIGS. 8–10 are optional, but when used, the etch stop 206 is a dielectric material having an etch rate different from the layers 202, 208, and 212. These etch stop layers may be, in one form, silicon nitride.

FIG. 8 illustrates that additional dielectric layers and etch stop layers 208, 210, and 212 are formed over the top of the layers 202, 204, and 206. These layers 208–212 are lithographically patterned and etched in one of many possible manners to form a dual inlaid interconnect structure 214 in FIG. 8. This interconnect structure 214 specifically contains an interconnect portion 214b and one or more contact portions 214a. The contact portion 214a exposes a top contact portion of the layer 204. It is important to ensure that a top portion of this layer 204 is sufficiently clean to ensure proper adhesion and electrical contact between the layer 204 and overlying conductive layers. In addition, rounding or faceting of the 90° corners within the inlaid structure 214 is advantageous in order to improve step coverage of various films that are deposited after the formation of structure 214. The simultaneous insitu cleaning of the surface of layer 204 along with rounding of the sharp corners within inlaid structure 214 can be performed together by the cleaning step illustrated in FIG. 2.

The surface cleaning and corner rounding process is illustrated in FIG. 9. In FIG. 9, the Ar+ ions 32 of FIG. 2 are accelerated towards a surface of the structure 200. This acceleration of the Ar+ ions 32 results in the sputtering of contaminants and residual oxides from a surface of the exposed portion of layer 204. Therefore, the Ar environment from FIG. 2 ensures that the surface of the layer 204 is adequately clean, which is required to ensure improved electrical contact as taught herein. In addition, the same Ar sputter process illustrated in FIG. 2 can be optimized to ensure that the corners 220 and 222 of the dual inlaid structure 214 are rounded to improve film step coverage. In one form, a high pressure sputter time period is devoted to rounding the corners 220 and 222 in FIG. 9 and a lower pressure sputter time period is then used to result in surface cleaning of a top portion of the layer 204.

After performing the surface cleaning operation and the corner rounding operation using the process illustrated in FIG. 2, the process illustrated in FIG. 3 is used to sputter a refractory metal material or like barrier material to form a layer 223 on a surface of the structure 200 as illustrated in FIG. 10. Following formation of the barrier or adhesion layer 223, a copper sputter operation from a copper (Cu) target is performed to form a thin copper seed layer 224 as illustrated in FIG. 10. It is important to note that other metals may be deposited into the dual inlaid structure as previously discussed.

Although the invention has been described and illustrated with reference to specific embodiments, it is not intended that the invention be limited to those illustrative embodiments. Those skilled in the art will recognize that modifications and variations may be made without departing from the spirit and scope of the invention. Therefore, it is intended that this invention encompass all of the variations and modifications as fall within the scope of the appended claims.

What is claimed is:

1. A method for making a semiconductor structure, the method comprising the steps of:
    placing a semiconductor substrate into a chamber, the semiconductor substrate having a surface characterized as having surface contamination thereon;
    pressurizing the chamber using a gas;
    applying power to a coil within the chamber to create a plasma including charged ions in the chamber;
    applying power to the semiconductor substrate to accelerate the charged ions toward the semiconductor substrate;
    cleaning the surface contamination on the surface of the semiconductor substrate by keeping the chamber pressurized for a predetermined time to create a cleaned surface on the semiconductor substrate;
    applying power to an electrode which is attached to a sputter target within the chamber to accelerate the charged ions away from the semiconductor substrate and toward the sputter target; and
    insitu sputtering material from a surface of the sputter target within the chamber to form a layer of material on the cleaned surface of the semiconductor substrate.

2. The method of claim 1 wherein the step of pressurizing the chamber comprises the step of:
    introducing an inert gas as the gas.

3. The method of claim 2 wherein the step of introducing the inert gas comprises:
    introducing argon (Ar) as the inert gas into the chamber.

4. The method of claim 3 wherein the step of pressurizing the chamber further comprises:
    introducing Ar as the inert gas into the chamber at a flow rate in a range of approximately 10 standard cubic centimeters per minute (sccm) to 100 sccm.

5. The method of claim 1 wherein the step of pressurizing the chamber comprises the step of:
    introducing a reactive gas as the gas.

6. The method of claim 5 wherein the step of introducing a reactive gas comprises the step of:
    introducing a gas from a set consisting essentially of hydrogen, nitrogen, oxygen, and a halide.

7. The method of claim 1 wherein the step of cleaning the surface of the semiconductor substrate comprises the step of:
    cleaning the surface of the semiconductor substrate using, alternatively, an inert gas and a reactive gas during different portions of the predetermined time.

8. The method of claim 7 wherein the step of cleaning the surface of the semiconductor substrate further comprises the steps of:
    cleaning the surface of the semiconductor substrate using the reactive gas during a first portion of the predetermined time and using the inert gas during a second, subsequent portion of the predetermined time.

9. The method of claim 1 wherein the step of applying power to the coil further comprises:
    applying power to a coil at radio frequency (RF).

10. The method of claim 1 wherein the step of applying power to the semiconductor substrate further comprises:
    applying power to the semiconductor substrate at a bias level within a range of approximately −30 volts to −500 volts.

11. The method of claim 10 wherein the step of applying power to the semiconductor substrate further comprises:
    applying power to the semiconductor substrate at a bias level within a range of approximately −30 volts to −40 volts.

12. The method of claim 1 wherein the step of insitu sputtering material from the surface of the sputter target further comprises:
    insitu sputtering a refractory metal material from the surface of the sputter target to form a silicide source on a semiconductive region of the cleaned surface of the semiconductor substrate.

13. The method of claim 1 wherein the step of insitu sputtering material from the surface of the sputter target further comprises:

insitu sputtering material from the surface of the sputter target to form a glue layer that aids in adhering a first layer to a second layer on the semiconductor substrate.

14. The method of claim 1 wherein the step of insitu sputtering material from the surface of the sputter target further comprises:

insitu sputtering material from the surface of the sputter target to form a barrier layer to prevent a subsequent layer from reacting with an underlying layer on the semiconductor substrate.

15. The method of claim 14 wherein the step of insitu sputtering material from the surface of the sputter target to form the barrier layer comprises:

insitu sputtering the material from the surface of the sputter target to form the barrier layer to prevent the subsequent layer from reacting with the underlying layer of an inlaid structure.

16. The method of claim 15 wherein the step of insitu sputtering material from the surface of the sputter target to form the barrier layer further comprises:

insitu sputtering the material from a surface of a sputter target to form the barrier layer to prevent the subsequent layer from reacting with the underlying layer of a dual inlaid structure.

17. A method for making a semiconductor structure, the method comprising the steps of:

placing a semiconductor substrate into a chamber, the semiconductor substrate having a surface characterized as having surface contamination thereon;

cleaning the surface contamination on the surface of the semiconductor substrate within the chamber to form a cleaned surface of the semiconductor substrate by creating a plasma using a coil located within the chamber and directing ions of the plasma to the surface of the semiconductor substrate; and insitu sputtering material from a surface of a sputter target within the chamber to form a layer of material on the cleaned surface of the semiconductor substrate.

18. The method of claim 17 further wherein the step of directing ions of the plasma comprises the step of:

directing ions of the plasma to the surface of the semiconductor substrate by applying power to the semiconductor substrate.

19. The method of claim 17 further wherein the step of insitu sputtering material from the surface of a sputter target comprises the step of:

directing ions of the plasma to a surface of a sputter target.

20. The method of claim 19 wherein the step of directing ions of the plasma to the surface of the sputter target further comprises the step of:

directing ions of the plasma to the surface of the sputter target by applying power to an electrode which is attached to the sputter target.

21. A method for making a semiconductor structure, the method comprising the steps of:

placing a semiconductor substrate on a wafer chuck in a chamber, the semiconductor substrate having an active surface characterized as having surface contamination thereon;

introducing argon (Ar) gas into the chamber at a flow rate between approximately 10 standard cubic centimeters per minute (sccm) and 100 sccm;

pressurizing the chamber to a pressure within a range of approximately 5 millitorr to 100 millitorr;

applying power to a coil within the chamber to create an Ar plasma from the Ar gas in the chamber;

applying power to the wafer chuck to bias the semiconductor substrate to a predetermined voltage within a range of approximately −30 volts to −40 volts;

cleaning the surface contamination on the active surface of the semiconductor substrate by keeping the chamber pressurized and the wafer chuck powered for a predetermined time to create a cleaned active surface on the semiconductor substrate;

applying power to an anode which is attached to a sputter target at an opposite end of the chamber from the semiconductor substrate; and in situ sputtering material from a surface of the sputter target to form a layer of material on the cleated active surface of the semiconductor substrate.

* * * * *

UNITED STATES PATENT AND TRADEMARK OFFICE
CERTIFICATE OF CORRECTION

PATENT NO. : 6,187,682 B1
DATED : February 13, 2001
INVENTOR(S) : Dean J. Denning et al.

It is certified that error appears in the above-identified patent and that said Letters Patent is hereby corrected as shown below:

Claim 21,
Line 43, replace "cleated" with -- cleaned --.

Signed and Sealed this

Twenty-eighth Day of August, 2001

*Attest:*

*Attesting Officer*

NICHOLAS P. GODICI
*Acting Director of the United States Patent and Trademark Office*